US010834843B1

(12) United States Patent
Erie et al.

(10) Patent No.: US 10,834,843 B1
(45) Date of Patent: Nov. 10, 2020

(54) MODULAR CABLING FIXTURE

(71) Applicant: INTERNATIONAL BUSINESS MACHINES CORPORATION, Armonk, NY (US)

(72) Inventors: Clinton William Erie, Adams, MN (US); Michael John MacPherson, Elgin, MN (US); Ryan Paske, Oronoco, MN (US); Donald Hrtanek, Mantorville, MN (US)

(73) Assignee: International Business Machines Corporaton, Armonk, NY (US)

( * ) Notice: Subject to any disclaimer, the term of this patent is extended or adjusted under 35 U.S.C. 154(b) by 0 days.

(21) Appl. No.: 16/441,154

(22) Filed: Jun. 14, 2019

(51) Int. Cl.
*H02B 1/20* (2006.01)
*H05K 7/14* (2006.01)

(52) U.S. Cl.
CPC .................................. *H05K 7/1491* (2013.01)

(58) Field of Classification Search
USPC ........................................................ 361/826
See application file for complete search history.

(56) References Cited

U.S. PATENT DOCUMENTS

| 6,118,075 | A | * | 9/2000 | Baker | ...................... | H04Q 1/06 |
| | | | | | | 174/100 |
| 6,315,249 | B1 | | 11/2001 | Jensen | | |
| 7,385,141 | B2 | * | 6/2008 | Keith | ...................... | H04Q 1/06 |
| | | | | | | 174/135 |
| 8,410,364 | B2 | | 4/2013 | Dunwoody | | |
| 9,577,414 | B2 | | 2/2017 | Krietzman | | |
| 10,098,249 | B2 | | 10/2018 | Adams | | |
| 2005/0265013 | A1 | | 12/2005 | Keith | | |
| 2007/0212010 | A1 | * | 9/2007 | Caveney | .............. | G02B 6/4453 |
| | | | | | | 385/135 |

FOREIGN PATENT DOCUMENTS

WO 2005025374 A2 3/2005

OTHER PUBLICATIONS

Lin et al., :"Planning Effective Power and Data Cable Management in IT Racks", White Paper 203, Revision O, Apr. 7, 2016, http://www.findwhitepapers.com/index.php?searchword=planning+effective . . . , pp. 1-15, printed Apr. 18, 2019.

* cited by examiner

*Primary Examiner* — Hung S. Bui
(74) *Attorney, Agent, or Firm* — Tihon Poltavets

(57) ABSTRACT

A modular cabling fixture includes a first structure, a second structure, and a third structure, where a position of the first structure, the second structure, and the third structure is based on a server rack configuration. A first set of members on a first end of the first structure capable of interlocking with a first set of members of the second structure and a second set of members on a second end of the first structure capable of interlocking with a first set of members of the third structure, The first structure includes a first portion of a channel for routing a cable harness, where a position of the first portion of the channel of the first structures is based on the server rack configuration, wherein the cable harness is insertable into the first portion of the channel.

17 Claims, 7 Drawing Sheets

MODULAR CABLING FIXTURE

FIELD OF THE INVENTION

This disclosure relates generally to cabling fixtures, and in particular, to modular cabling fixtures configurable according to a product specification.

BACKGROUND OF THE INVENTION

Presently, the computer industry utilizes various servers, storage, and networking devices, all interconnected with cables for providing power and data. Proper cable placement during manufacturing and installation of the devices ensures that cables are arranged and secured in a repeatable, robust, organized, and serviceable manner. The arrangement and securement of the cables is based on a configuration of a device and typically has to adhere to cable specification (e.g., bend radii) to ensure cable integrated is maintained through the usage life of the cable. Due to the various possible configurations of certain devices, such as server equipment, the arrangement and securement of the cables is typically a one-off solution or rarely repeated for another configuration.

SUMMARY

One aspect of an embodiment of the present invention discloses an apparatus for a modular cabling fixture comprising a first structure, a second structure, and a third structure, wherein a position of the first structure, the second structure, and the third structure is based on a server rack configuration. The modular cabling fixture further comprising a first set of members on a first end of the first structure capable of interlocking with a first set of members of the second structure, wherein at least one member from the first set of members is insertable into a first void between two members of the first set of members of the second structure. The modular cabling fixture further comprising a second set of members on a second end of the first structure capable of interlocking with a first set of members of the third structure, wherein at least one member from the second set of members is insertable into a second void between two members of the first set of members of the third structure. The modular cabling fixture further comprising the first structure includes a first portion of a channel for routing a cable harness, wherein a position of the first portion of the channel of the first structures is based on the server rack configuration, wherein the cable harness is insertable into the first portion of the channel.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

Figure 1A:
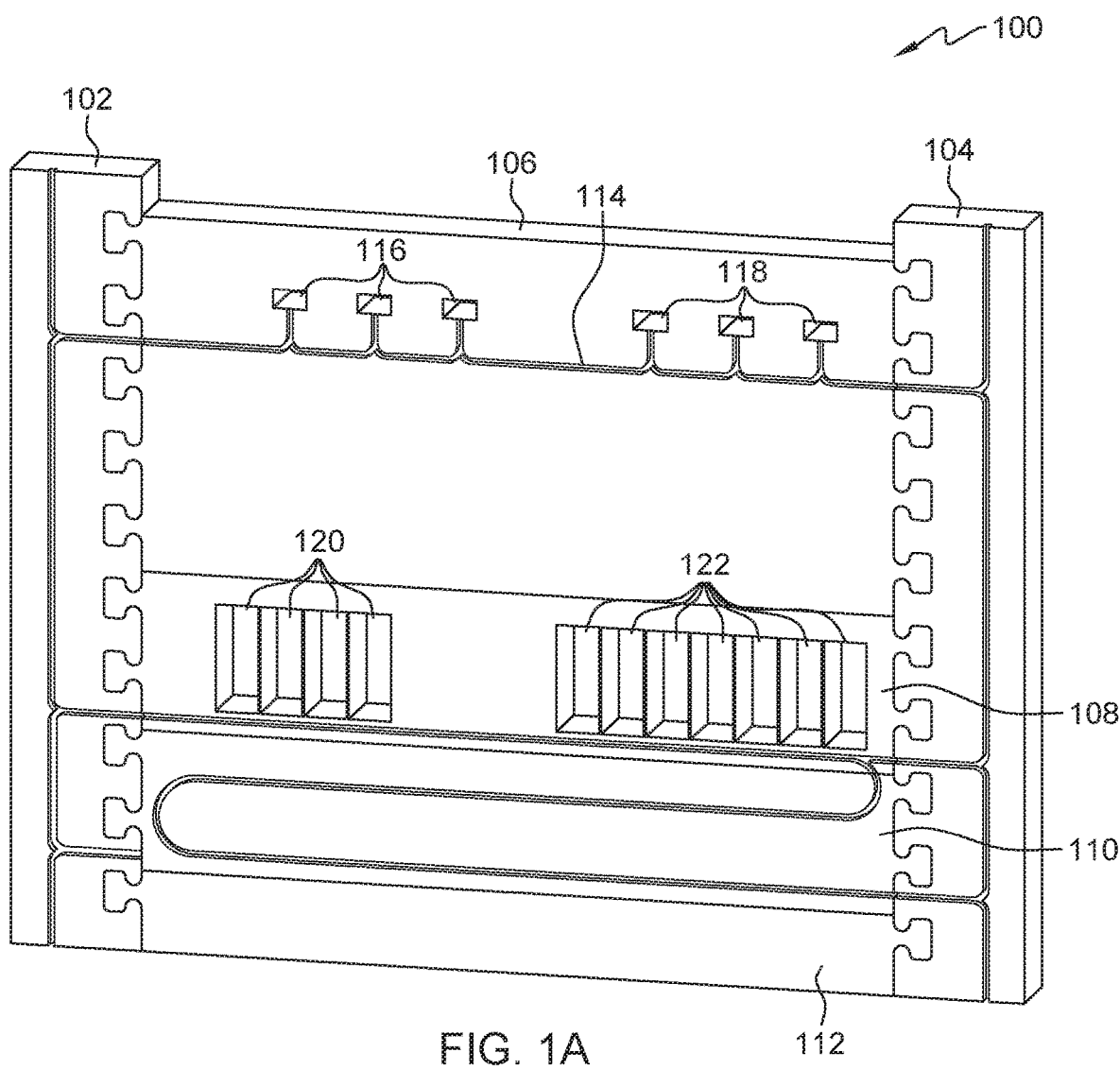
FIG. 1A depicts a 3-dimensional view of a modular cabling fixture, in accordance with an embodiment of the present invention.

Embodiments of the present invention provide a modular cabling fixture with multiple interchangeable sections based on a product configuration for arranging and securing a cable harness prior to installation on a server rack. The multiple interchangeable sections of the modular cabling fixture are adjustable to fit a type, u-size increment, and position of each machine of the product configuration on the server rack. An interchangeable section is capable of being coupled to another interchangeable section utilizing interlocking tabs. The modular cabling fixture also accounts for a device (e.g., PCI adapters) location and a device configuration (i.e., port location on the device) within the machine on the server rack. The modular cabling fixture provides for cable arrangement according to cabling tolerances including but not limited to cable management arms, bend radii, and routing within the server rack. The modular cabling fixture also provides unique identifiers for each of the multiple interchangeable sections for rapid and repeatable cable harness. The modular cabling fixture allows for scalability based on an application and/or configuration to account for servers, switches, storage drawers, or any other components positioned in the server rack.

Detailed embodiments of the present invention are disclosed herein with reference to the accompanying drawings; however, it is to be understood that the disclosed embodiments are merely illustrative of potential embodiments of the invention and may take various forms. In addition, each of the examples given in connection with the various embodiments is also intended to be illustrative, and not restrictive. This description is intended to be interpreted merely as a representative basis for teaching one skilled in the art to variously employ the various aspects of the present disclosure. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure or first member, is present on a second element, such as a second structure or second member, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The term substantially, or substantially similar, refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

FIG. 1A depicts a 3-dimensional view of a modular cabling fixture, in accordance with an embodiment of the present invention. In this embodiment, modular cabling fixture 100 is associated with a specific machine configuration on a server rack and includes multiple interchangeable sections. The multiple interchangeable sections include left section 102, right section 104, section 106, section 108, section 110, section 112. Section 106 is a 5U (5 rack unit) block, section 108 is a 2U (two rack unit) block, section 110 is a 2U (two rack unit) block, and section 112 is a 1U (one rack unit) block. A sum of all the multiple interchangeable sections of modular cabling fixture 100 is 10U (10 rack units) and modular cabling fixture 100 is associated with a quarter rack of the server rack, which typically holds 10U-12U. A full rack is typically equal to 42U block count and a half rack typically holds 18U-22U block count. Left section 102 and right section 104 represent side boundaries of the server rack for which a cable harness is created and in other embodiments, left section 102 and right section 104 can each equal a length to accommodate a half rack and/or a full rack.

Channel 114 present in left section 102, right section 104, section 106, section 108, and section 110 allows for cable routing based on an arrangement of the multiple interchangeable sections. Section 110 represents an empty block on the server rack where a machine is not present. Therefore, routing the cable harness through section 110 is not necessary for the specific machine configuration associated with modular cabling fixture 100. Modular cabling fixture 100 can be constructed out of a foam material, such as polyethylene or polyurethane, to allow for channel 114 to hold and release the cable harness without damaging the cable harness. It is to be noted that other materials (e.g., rubber and plastics) know in the art can be utilized in the construction of modular cabling fixture 100. In this embodiment, channel 114 is u-shaped and is etched into left section 102, right section 104, section 106, section 108, and section 110. A width and depth of channel 114 is dependent on the cable harness being created to ensure that channel 114 can hold and release any cable harness of varying diameter. Channel 114 can deform and/or expand from an original form to accommodate various sized cable harnesses and can return to the original form once the cable harness is removed from channel 114.

In other embodiments, channel 114 includes one or more tabs extending over the u-shaped cavity to assist in holding the cable harness in channel 114, thus preventing the cable harness from lifting out of channel 114. The one or more tabs can either partially extend or fully extend over the u-shaped cavity of channel 114. For the one or more tabs that partially extend over channel 114, a user can place the cable harness in the remaining opening that is not partially covered the one or more tabs. For the one or more tabs that fully extend over channel 114, the user can router the cable harness beneath the one or more tabs. Alternatively, the one or more tabs that fully extended over the u-shaped cavity of channel 112 can be removable, where the cable harness is disposed into channel 114 and the one or more tabs are disposed over channel 114 to secure the cable harness to modular cabling fixture 100. Subsequently, the one or more tabs disposed over channel 114 are removed to allow for the cable harness to be released from modular cabling fixture 100.

Apertures 116 and 118 of section 106 allow for placement of multiple connectors of the cable harness, where the multiple connectors electrically couple to a machine on the server rack. A position of each of apertures 116 and 118 is dependent on a location of each of the multiple connectors of the cable harness that are to be coupled to the machine. In this embodiment, dimensions for each of apertures 116 and 118 are greater than dimensions of each of the multiple connectors, where each of the multiple connectors can pass through each of the respective apertures 116 and 118. Channel 114 leads to each aperture 116 and 118, such that the cable harness exits channel 114 in a (+) y-axis direction, bends towards each apertures 116 and 118, and a portion of the cable harness (along with a respective connector) passes through each apertures 116 and 118. In alternative embodiment, dimensions for each of apertures 116 and 118 are such that a respective connector of the cable harness is held in place. Holders 120 and 122 of section 108 allow for placement of multiple interchanged subsections (i.e., blocks) based on a further configuration of a single machine out of multiple machines in a server rack configurations. Holders 120 and 122 are discussed in further detail with regards to FIG. 2.

For left section 102, a primary portion of channel 114 is etched or molded along the y-axis and multiple secondary portions of channel 114 branch off the primary portion and are etched or molded along the (+) x-axis direction towards sections 106, 108, 110, and 112. For right section 104, a primary portion of channel 114 is etched or molded along the y-axis and multiple secondary portions of channel 114 branch off the primary portion and are etched or molded along the (−) x-axis direction towards sections 106, 108, 110, and 112. For section 106, a primary portion of channel 114 is etched or molded along the x-axis and multiple secondary portions of channel 114 branch off the primary portion and are etched or molded along the (+) y-axis direction towards apertures 116 and 118. For section 108, a primary portion of channel 114 is etched or molded along the x-axis and multiple secondary portions of channel 114 branch off the primary portion and are etched or molded along the (+) y-axis direction towards holders 120 and 122.

An orientation of modular cabling fixture 100 is not limited to the orientation illustrated in FIG. 1A and can be rotated to any degree ($0° \leq x \leq 360°$) depending on a machine configuration on a server rack. For example, if modular cabling fixture 100 is rotated 180°, left section 102 is positioned on the right hand side of the server rack and right section 104 is positioned on the left hand side of the server rack.

Figure 1B:
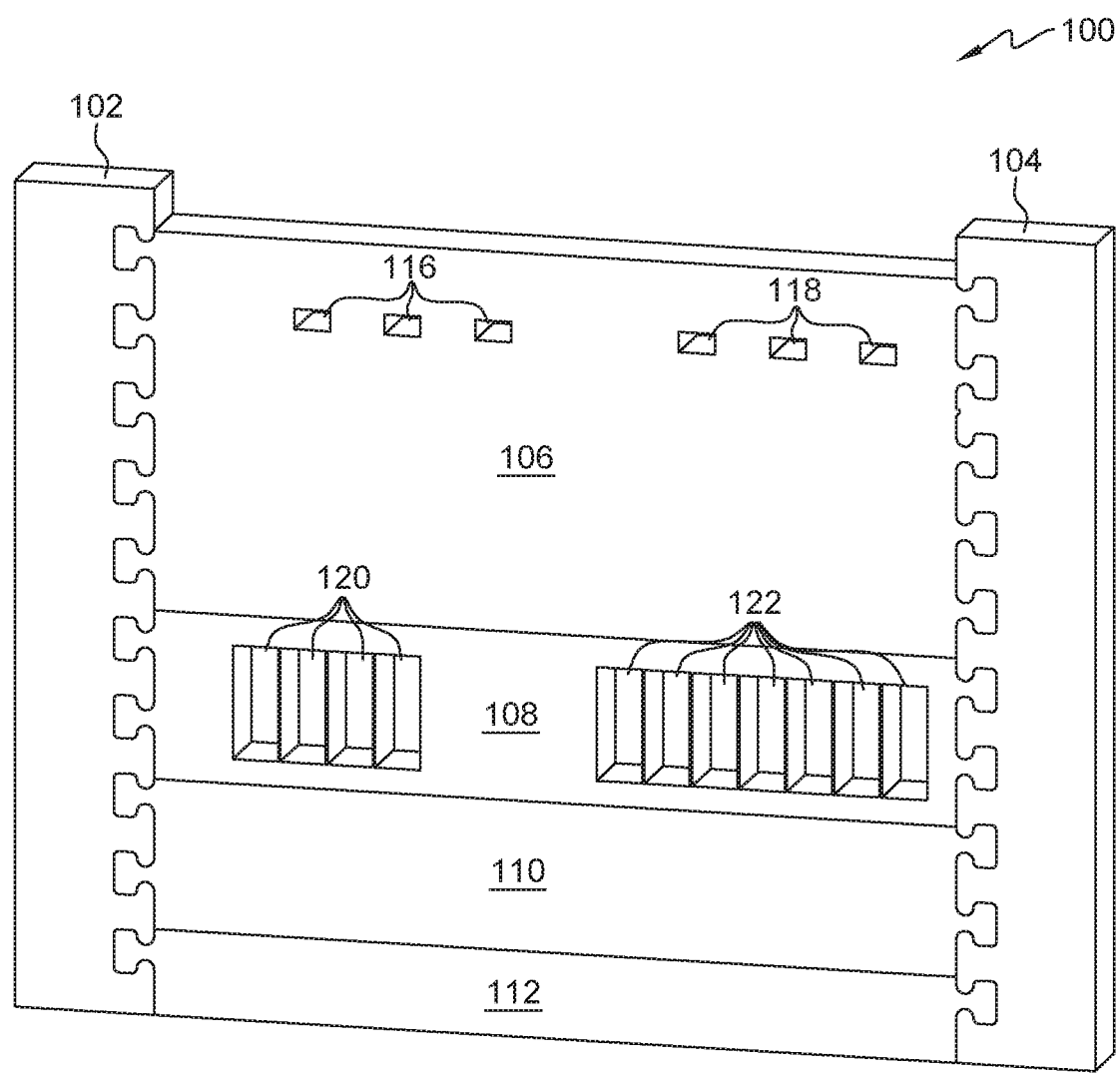
FIG. 1B depicts a simplified 3-dimensional view of the modular cabling fixture from FIG. 1A, in accordance with an embodiment of the present invention.

FIG. 1B depicts a simplified 3-dimensional view of the modular cabling fixture from FIG. 1A, in accordance with an embodiment of the present invention. As previously discussed, modular cabling fixture 100 includes multiple interchangeable sections: left section 102, right section 104, section 106-112, apertures 116, 118, along with holders 120 and 122. Connector and/or adapter locations for each of the machines in the server rack configuration dictate a position of apertures 116 and 118, along with holders 120 and 122. Channel 114 (not illustrated in FIG. 1B) is etched or molded into modular cabling fixture 100 based on the connector and/or adapter location requirements of the cable harness.

Figure 1C:
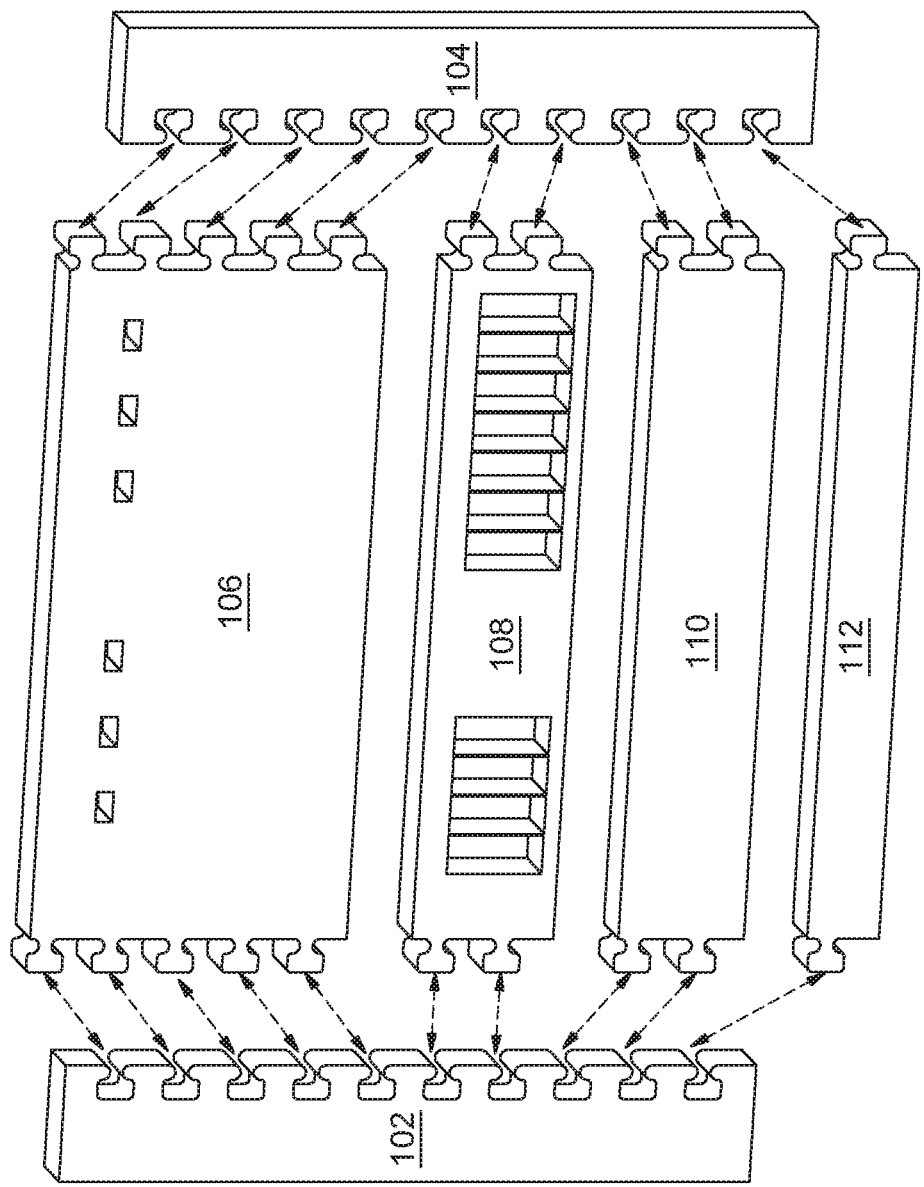
FIG. 1C depicts a simplified exploded 3-dimensional view of the modular cabling fixture from FIG. 1B, in accordance with an embodiment of the present invention.

FIG. 1C depicts a simplified exploded 3-dimensional view of the modular cabling fixture from FIG. 1B, in accordance with an embodiment of the present invention. Modular cabling fixture 100 utilizes interlocking tabs to connect one or more of the multiple interchangeable sections (e.g., left section 102 and section 106). In this embodiment, left section 102 and right section 104 dictate the placement of the sections 106, 108, 110, and 112, where spacing of each interlocking tab of left section 102 and right section 104 is associated with a single rack unit. A number of interlocking tabs of left section 102 and right section 104 associated with a single rack unit or any other standardized unit of measurement for a server rack frame can vary (e.g., 3 interlocking tabs per rack unit) depending on an application of modular cabling fixture 100. Each interlocking tab of sections 106, 108, 110, and 112 is pressable into a void located between two interlocking tabs of either, left section 102 or right section 104. Alternatively, each interlocking tab of left section 102 and right section 104 is pressable into a void located between two interlocking tabs of sections 106, 108, 110, and 112. It is to be noted, that the two interlocking tabs can be located across two different section (e.g., section 106 and 108), where a single interlocking tab of left section 102 or right section 104 is placeable in a void between a first interlocking tab of section 106 and a second interlocking tab of section 108.

In another embodiment, left section 102 and right section 104 each include a plurality of cavities, where multiple protruding members from any of section 106, 108, 110, and 112 are placed inside of the plurality of cavities. The protruding members of sections 106, 108, 110, and 112 are slidable and lockable once placed inside the plurality of cavities of left section 102 and right section 104. A manner in which left section 102 and right section 104 couple to sections 106, 108, 110, and 112 is such that a position of the multiple interchangeable sections is switchable. In the illustrated embodiment, the multiple interchangeable section are placed in the following order in modular cabling fixture 100 between left section 102 and right section 104: section 106, 108, 110, and 112. In alternative embodiment, the multiple interchangeable section are placed in the following order in modular cabling fixture 100 between left section 102 and right section 104: section 110, 108, 112, and 106.

Figure 2:
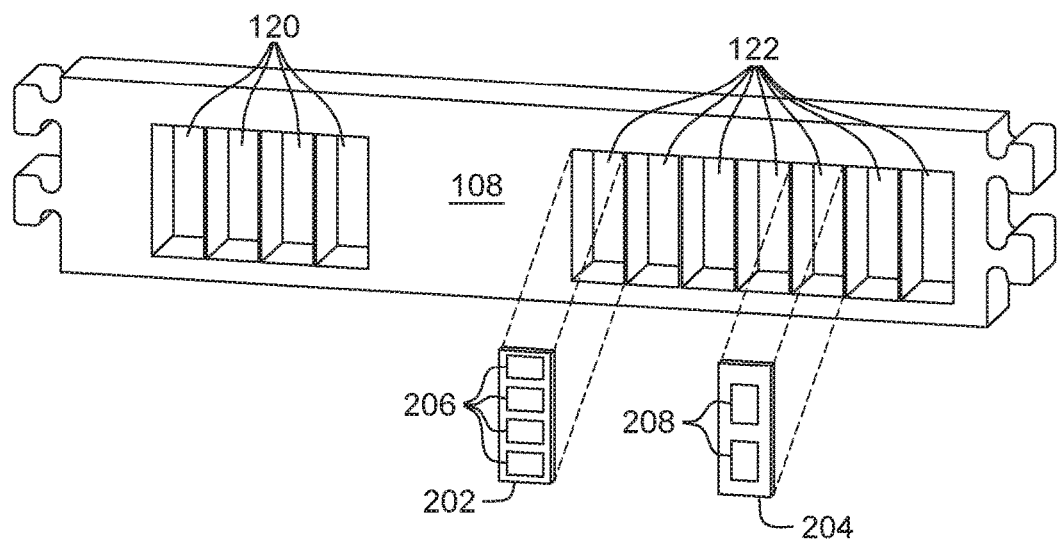
FIG. 2 depicts a simplified 3-dimensional view of an example section of the modular cabling fixture from FIG. 1A, in accordance with an embodiment of the present invention.

FIG. 2 depicts a simplified 3-dimensional view of an example section of the modular cabling fixture from FIG. 1A, in accordance with an embodiment of the present invention. As previously discussed, section 108 includes holders 120 and 122 for placement of multiple interchangeable subsections based on a further configuration of a single machine out of multiple machines in a server rack configuration. Examples of the multiple interchangeable subsections includes block 202 and 204, where block 202 and 204 simulate specific network adapters (e.g., SAS adapter, IB adapter) that are insertable in the single server or storage block. Blocks 202 and 204 are insertable into each of the holders 120 and 122 prior to creating the cable harness and removable subsequent to creating the cable harness. Blocks 202 and 204 include sub-holders 206 and 208, where each sub-holder 206 and 208 includes a cavity or aperture for connector or cable placement. For one or more holders 120 and 122 where an electronic component is not present, a sub-holder 206 or 208 is not inserted into the one or more holders 120 and 122 or alternatively, a blank sub-holder (not illustrated in FIG. 2) is inserted to the one or more holders 120 and 122 where the electronic component is not present.

Unique identifiers are utilized to configure section 108, along with holders 120 and 122 according to a specific configuration of a single machine. Section 108 includes a first unique identifier (e.g., quick response code, data matrix) which is associated with the single machine that is installed on the server rack housing multiple machines. Furthermore, each holder 120 and 122, along with each block 202 and 204 can include a unique identifier for configuring section 108 according to the specific configuration of the single machine associated with section 108. The specific configuration includes multiple unique identifiers combinations to ensure a correct placement of each block 202 and 204 into a correct corresponding position for each holder 120 and 122.

Figure 3:
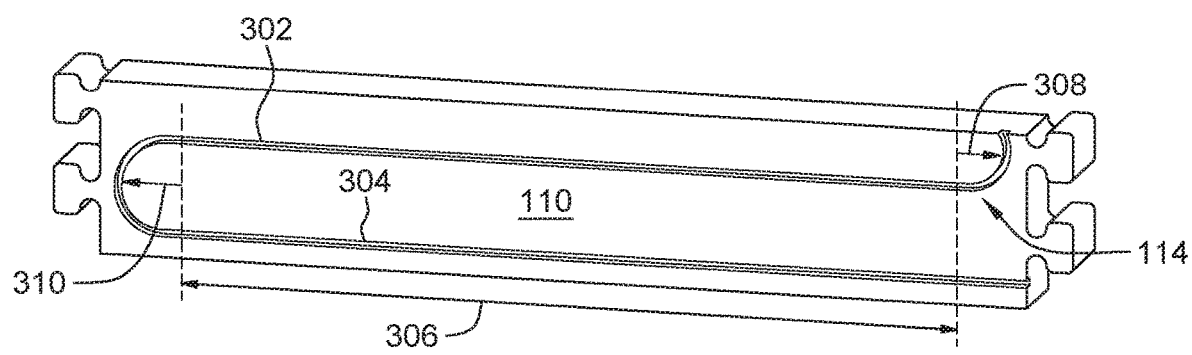
FIG. 3 depicts a simplified 3-dimensional view of another example section of the modular cabling fixture from FIG. 1A, in accordance with an embodiment of the present invention.

FIG. 3 depicts a simplified 3-dimensional view of another example section of the modular cabling fixture from FIG. 1A, in accordance with an embodiment of the present invention. Section 110 includes channel 114 for cable placement, where channel 114 is further represented by upper channel 302 and lower channel 304. In this embodiment, section 110 with channel 114 accounts for critical cabling tolerances such as cable management arms, bend radii, and routing within a server rack or machine cabinet. First bend radius 308 at a first end of upper channel 302 and second bend radius 310 at a second end of upper channel 302 represent a predetermined bend radius for the cable harness for which material flexibility is taken into account. First bend radius 308 includes a 90° direction change for the cable harness and second bend radius 310 includes a 180° direction changes for the cable harness. Upper channel 302 and lower channel 304 are connected by a curved channel as defined by second bend radius 310. A total length of upper channel 302 and lower channel 304 takes into account whether the cable harness is to be coupled to an extendable cable management arm or if the cable harness is to be routed within a server rack or machine cabinet.

Figure 4:
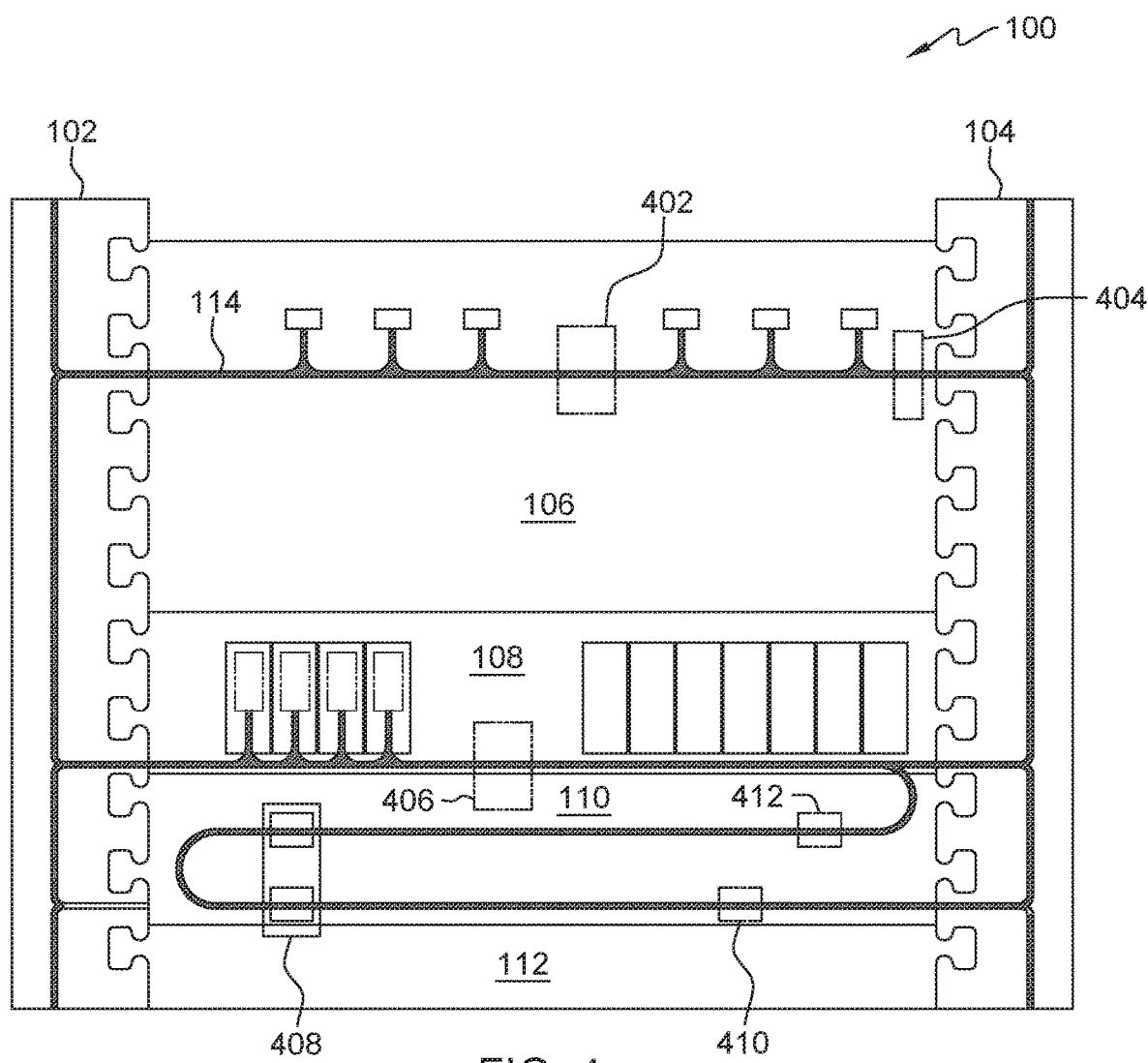
FIG. 4 depicts a 2-dimensional view of a modular cabling fixture with cable securement areas, in accordance with an embodiment of the present invention.

FIG. 4 depicts a 2-dimensional view of a modular cabling fixture with cable securement areas, in accordance with an embodiment of the present invention. In this embodiment, a cable harness is placed inside channel 114 across left section 102, right section 104, and sections 106-112 with multiple harness areas. Each harness area can indicate whether the cable harness is to be fastened directly to the server rack and/or cable management arm, or wrapped for cable management reasons. Section 106 includes harness areas 402 and 404 for securing the harness utilizing one or more fasteners including but not limited to tape, zip-ties, and hook-and-loop fasteners. Harness area 406 is located across section 108 and 110, where harness areas 410 and 412 are located in section 110. Spacer area 408 in section 110 represents a placement of a cable spacer for maintaining a constant bend radius for the cable harness. Spacer area 408 and harness areas 402, 404, 406, 410, and 412 ensures that a cable harness can be replicated at a later time if another identical cable harness is to be created as a replacement or for a similar product configuration.

Figure 5:
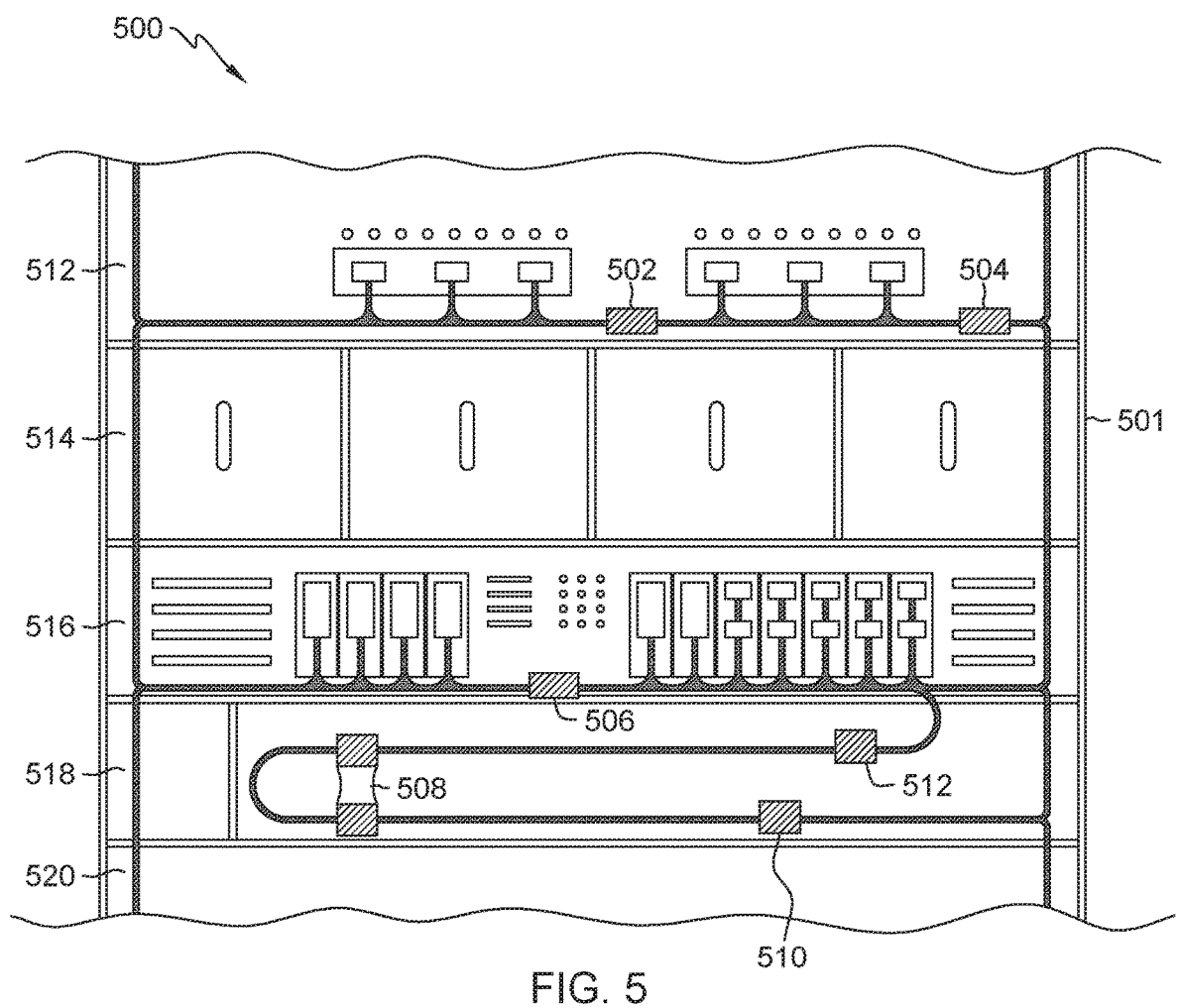
FIG. 5 depicts a 2-dimensional view of a cable assembled utilizing the modular cabling fixture installed on a server rack, in accordance with an embodiment of the present invention.

FIG. 5 depicts a 2-dimensional view of a cable assembled utilizing the modular cabling fixture installed on a server rack, in accordance with an embodiment of the present invention. In this embodiment, server rack 500 includes server frame 501 with multiple machines configured according to customer specification. The cable harness installed on server rack 500 was created utilizing modular cabling fixture 100, where fasteners 502, 504, 506, 510, and 512 respectively correspond to harness areas 402, 404, 406, 410, and 412, previously illustrated in FIG. 4. Spacer 508 corresponds to spacer area 408 from FIG. 4, for maintaining the bend radius of the cable harness. Server sections 512 and 514 correspond to section 106 of the modular cabling fixture 100, server sections 516 corresponds to section 108 of modular cabling fixture 100, server sections 518 corresponds to section 110 of the modular cabling fixture 100, and server sections 520 corresponds to section 112 of the modular cabling fixture 100.

Figure 6:
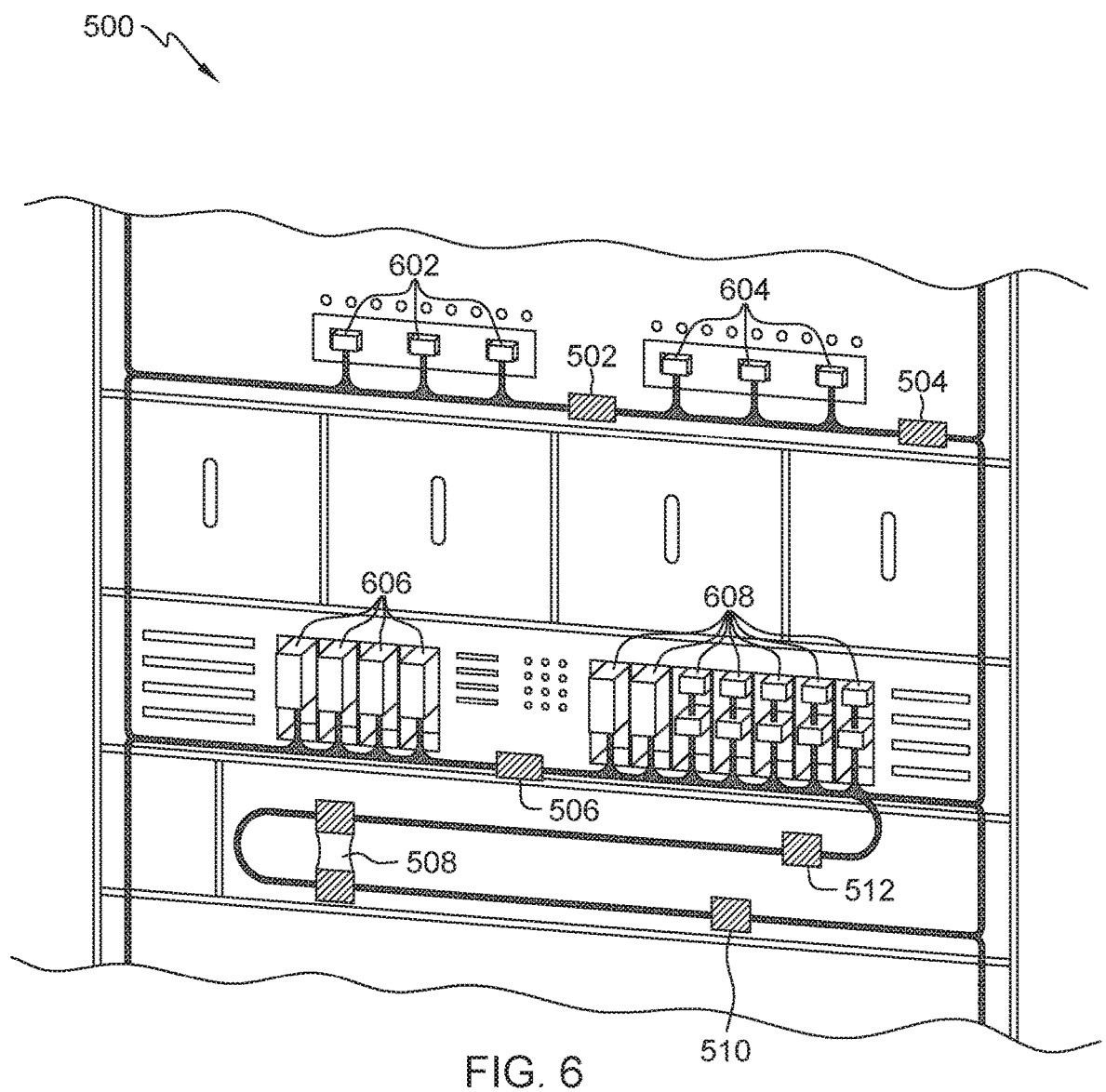
FIG. 6 depicts a 3-dimensional view of the cable assembled utilizing the modular cabling fixture installed on the server rack from FIG. 5, in accordance with an embodiment of the present invention.

FIG. 6 depicts a 3-dimensional view of the cable assembled utilizing the modular cabling fixture installed on the server rack from FIG. 5, in accordance with an embodiment of the present invention. The cable harness installed on server rack 500 includes connectors 602 and 604 respectively corresponding to apertures 116 and 118 of modular cabling fixture 100. The cable harness further includes connector adapters 606 and 608 respectively corresponding to holders 120 and 122 of modular cabling fixture 100. In this embodiment, fasteners 502 and 504 secure the cable harness to a first machine and fastener 506 secures the cable harness to a second machine. Space 508 maintains the bend radius of the cable harness and fasteners 510 and 512 wraps around the cable harness for cable management reasons, to ensure that the two or more cables that comprise the cable harness do not separate.

The terminology used herein is for the purpose of describing particular embodiments only and is not intended to be limiting to the invention. As used herein, the singular forms "a", "an" and "the" are intended to include the plural forms as well, unless the context clearly indicates otherwise.

Having described preferred embodiments of a modular cabling fixture (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. An apparatus for a modular cabling fixture, the apparatus comprising:
a first structure, a second structure, and a third structure, wherein a position of the first structure, the second structure, and the third structure is based on a server rack configuration;
a first set of members on a first end of the first structure capable of interlocking with a first set of members of the second structure, wherein at least one member from the first set of members is insertable into a first void between two members of the first set of members of the second structure;
a second set of members on a second end of the first structure capable of interlocking with a first set of members of the third structure, wherein at least one member from the second set of members is insertable into a second void between two members of the first set of members of the third structure; and
the first structure includes a first portion of a channel for routing a cable harness, wherein a position of the first portion of the channel of the first structures is based on the server rack configuration, wherein the cable harness is insertable into the first portion of the channel, wherein an upper channel of the first portion and a lower channel of the first portion are connected by a curved channel as defined by a bend radius.

2. The apparatus of claim 1, wherein the position of the first portion of the channel of the first structure corresponds to a placement of the cable harness with respect to a first machine in the server rack configuration.

3. The apparatus of claim 2, wherein the position of the first portion of the channel of the first structure further corresponds to a placement of the cable harness with respect to a first connector location on the first machine in the server rack configuration.

4. The apparatus of claim 3, further comprising:
a first cavity in the first structure, wherein the first connector of the cable harness is insertable into the first cavity.

5. The apparatus of claim 2, wherein the position of the first portion of the channel of the first structure further corresponds to a placement of the cable harness with respect to a first device location on the first machine in the server rack configuration.

6. The apparatus of claim 5, further comprising:
a first cavity in the first structure, wherein a fourth structure corresponding to the first device on the first machine is insertable into the first cavity, wherein one or more cavities of the fourth structure are based on a configuration of the first device.

7. The apparatus of claim 6, further comprising:
a first unique identifier on the first structure, wherein the first unique identifier is associated with the first machine in the server rack configuration.

8. The apparatus of claim 7, further comprising:
a second unique identifier on the first structure corresponding to the first cavity in the first structure, wherein the second unique identifier is associated with a position of the first device on the first machine.

9. The apparatus of claim 8, further comprising:
a third unique identifier on the fourth structure, wherein the third unique identifier is associated with the first device on the first machine.

10. The apparatus of claim 1, wherein the position of the first portion of the channel of the first structure corresponds to a placement of the cable harness with respect to a cable management arm in the server rack configuration.

11. The apparatus of claim 1, wherein the bend radius is based on a material flexibility of the cable harness.

12. The apparatus of claim 11, further comprising:
a spacer area on the first structure, wherein the spacer area on the first structure indicates a first portion of the cable harness for securement to a second portion of the cable harness to maintain the bend radius.

13. The apparatus of claim 1, wherein the first structure corresponds to one or more rack units on the server rack.

14. The apparatus of claim 13, wherein the second structure corresponds to a first side of the server rack, the third structure corresponds to a second side of the server rack, and the first structure corresponds to one or more rack units on the server rack located between the first side and the second side of the server rack.

15. The apparatus of claim 1, further comprising:
the second structure includes a second portion of the channel for routing the cable harness, wherein the first portion of the channel aligns with the second portion of the channel; and
the third structure includes a third portion of the channel for routing the cable harness, wherein the first portion of the channel aligns with the third portion of the channel.

16. The apparatus of claim 1, further comprising:
a harness area on the first structure, wherein the harness area on the first structure indicates a portion of the cable harness for securement to the server rack.

17. The apparatus of claim 1, further comprising:
a harness area on the first structure, wherein the harness area on the first structure indicates a portion of the cable harness for securement to a cable management arm of the server rack.

\* \* \* \* \*